US012469464B2

(12) United States Patent
Kim et al.

(10) Patent No.: US 12,469,464 B2
(45) Date of Patent: Nov. 11, 2025

(54) DISPLAY DEVICE AND DISPLAY DRIVING METHOD

(71) Applicant: LG Display Co., Ltd., Seoul (KR)

(72) Inventors: Jaemin Kim, Paju-si (KR); Subin Park, Jeonju-si (KR); Bonghwan Kim, Ulsan (KR); Won-Seok Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/733,342

(22) Filed: Jun. 4, 2024

(65) Prior Publication Data

US 2024/0321223 A1 Sep. 26, 2024

Related U.S. Application Data

(63) Continuation of application No. 18/218,491, filed on Jul. 5, 2023, now Pat. No. 12,033,590, which is a
(Continued)

(30) Foreign Application Priority Data

Sep. 16, 2021 (KR) ........................ 10-2021-0124376

(51) Int. Cl.
*G09G 3/3291* (2016.01)
*H01L 21/768* (2006.01)
(Continued)

(52) U.S. Cl.
CPC ..... *G09G 3/3291* (2013.01); *H01L 21/76877* (2013.01); *H01L 23/5226* (2013.01);
(Continued)

(58) Field of Classification Search
CPC .. G09G 3/3233; G09G 3/3208; G09G 3/3258; G09G 2300/0819;
(Continued)

(56) References Cited

U.S. PATENT DOCUMENTS

| | | | |
|---|---|---|---|
| 2019/0096335 | A1 | 3/2019 | Kim et al. |
| 2020/0111418 | A1 | 4/2020 | Nam et al. |

(Continued)

FOREIGN PATENT DOCUMENTS

| | | | |
|---|---|---|---|
| KR | 10-2019-0036579 | A | 4/2019 |
| KR | 10-2020-0039071 | A | 4/2020 |
| KR | 10-2021-0055146 | A | 5/2021 |

OTHER PUBLICATIONS

United States Office Action, U.S. Appl. No. 17/728,676, filed Sep. 23, 2022, 13 pages.

(Continued)

*Primary Examiner* — Benjamin C Lee
(74) *Attorney, Agent, or Firm* — Fenwick & West LLP

(57) ABSTRACT

Embodiments of the present disclosure relate to a display device, comprising: a display panel including a light emitting element, a driving transistor configured to provide a driving current to the light emitting element, and a plurality of switching transistors configured to control an operation of the driving transistor; a gate driving circuit configured to supply a plurality of scan signals to the display panel; a data driving circuit configured to supply a plurality of data voltages to the display panel; and a timing controller configured to control the gate driving circuit and the data driving circuit, wherein a bias voltage is supplied to the driving transistor in a first period in which the data voltage is supplied to the display panel at a low speed mode which the display panel is driven at a low speed driving frequency.

19 Claims, 15 Drawing Sheets

Related U.S. Application Data continuation of application No. 17/728,676, filed on Apr. 25, 2022, now Pat. No. 11,735,123.

(51) Int. Cl.

| | |
|---|---|
| ***H01L 23/522*** | (2006.01) |
| ***H10D 30/62*** | (2025.01) |
| ***H10D 62/13*** | (2025.01) |

(52) U.S. Cl.

CPC ......... *H10D 30/62* (2025.01); *H10D 30/6219* (2025.01); *H10D 62/151* (2025.01); *G09G 2300/0426* (2013.01); *G09G 2300/0842* (2013.01); *G09G 2310/08* (2013.01); *G09G 2320/0247* (2013.01)

(58) Field of Classification Search

CPC ... G09G 2300/0861; G09G 2300/0842; G09G 2300/0852; G09G 2320/045; G09G 2320/043; G09G 2320/0247; G09G 2310/0262; G09G 2310/0251; G09G 2310/0267

See application file for complete search history.

(56) References Cited

U.S. PATENT DOCUMENTS

| | | | | |
|---|---|---|---|---|
| 2020/0312244 | A1 | 10/2020 | Yang et al. | |
| 2021/0097930 | A1* | 4/2021 | An | G09G 3/32 |
| 2021/0125543 | A1* | 4/2021 | Kim | G09G 3/3233 |
| 2021/0142733 | A1 | 5/2021 | Kim et al. | |
| 2021/0150985 | A1* | 5/2021 | Li | G09G 3/2003 |
| 2021/0350740 | A1* | 11/2021 | Byun | G09G 3/3233 |
| 2022/0044634 | A1* | 2/2022 | Ka | G09G 3/3291 |

OTHER PUBLICATIONS

United States Office Action, U.S. Appl. No. 17/728,676, filed Jan. 4, 2023, 12 pages.

Korean Intellectual Property Office, Office Action, Korean Patent Application No. 10-2021-0124376, Dec. 18, 2024, seven pages, (with concise explanation of relevance).

Korean Intellectual Property Office, Notice of Allowance, Korean Patent Application No. 10-2021-0124376, Aug. 29, 2025, four pages.

* cited by examiner

DISPLAY DEVICE AND DISPLAY DRIVING METHOD

CROSS-REFERENCE TO RELATED APPLICATION

This application is a continuation of U.S. patent application Ser. No. 18/218,491 filed on Jul. 5, 2023, which is a continuation of U.S. patent application Ser. No. 17/728,676 filed Apr. 25, 2022, which claims the priority benefit of Republic of Korea Patent Application No. 10-2021-0124376, filed on Sep. 16, 2021, in the Korean Intellectual Property Office, each of which is hereby incorporated by reference in its entirety.

BACKGROUND

1. Technical Field

The present disclosure relates to a display device and a display driving method capable of reducing defects of image quality appearing on a display panel in a process of changing a driving frequency.

2. Discussion of the Related Art

With the development of the information society, there has been an increasing demand for a variety of types of image display devices. In this regard, a range of display devices, such as liquid crystal display device, and organic light emitting display device, have recently come into widespread use.

Among such display devices, the organic light emitting display devices have superior properties, such as rapid response speeds, high contrast ratios, high emissive efficiency, high luminance, and wide viewing angles, since self-emissive organic light emitting diodes are used as a light emitting element.

Such an organic light emitting display device may include organic light emitting diodes disposed in a plurality of subpixels aligned in a display panel, and may control the organic light emitting diodes to emit light by controlling a voltage flowing through the light emitting diodes, so as to display an image while controlling luminance of the subpixels.

In this case, the image data supplied to the display device may be a still image or a moving image variable at a constant speed, and even in the case of a moving image, it may be various types of images such as sports images, movies, or game images.

In addition, the display device may be switched to various operation modes according to a user's input or operation state.

On the other hand, the display device may change the driving frequency according to the type of input image data or operation mode. In the process of changing the driving frequency, a luminance deviation is occurred, which causes image distortion or quality degradation such as flicker.

SUMMARY

Accordingly, a display device and a display driving method are disclosed that are capable of reducing defects of image quality occurring in the process of changing the driving frequency.

Embodiments of the present disclosure provide a display device and a display driving method capable of reducing defects of image quality by applying a bias voltage to prevent a luminance degradation of a light emitting element at a time when a driving frequency is changed from a high speed driving frequency to a low speed driving frequency.

Embodiments of the present disclosure provide a display device and a display driving method capable of reducing defects of image quality by controlling the level of a stabilization voltage applied to a driving transistor at a time when the driving frequency is changed from a high speed driving frequency to a low speed driving frequency.

Embodiments of the present disclosure provide a display device and a display driving method capable of reducing defects of image quality by controlling the level of a reset voltage applied to a light emitting element at a time when the driving frequency is changed from a high speed driving frequency to a low speed driving frequency.

The problems to be described below according to the embodiments of the present disclosure are not limited to the problems mentioned above, and other problems that are not mentioned will be clearly understood by those skilled in the art from the following description.

A display device according to an embodiment of the present disclosure includes a display panel including a light emitting element, a driving transistor for providing a driving current to the light emitting element and a plurality of switching transistors for controlling the operation of the driving transistor, a gate driving circuit configured to supply a plurality of scan signals to the display panel, a data driving circuit configured to supply a plurality of data voltages to the display panel, and a timing controller configured to control the gate driving circuit and the data driving circuit, wherein a bias voltage is supplied to the driving transistor in a first period in which the data voltage is supplied to the display panel at a low speed mode which the display panel is driven at a low speed driving frequency.

In the display device according to an embodiment of the present disclosure, the plurality of switching transistors include a first switching transistor to which a first scan signal is supplied to a gate electrode, a drain electrode is connected to a gate electrode of the driving transistor, and a source electrode is connected to a source electrode of the driving transistor; a second switching transistor to which a second scan signal is supplied to a gate electrode, a data voltage or the bias voltage is supplied to a drain electrode, and a source electrode is connected to a drain electrode of the driving transistor; a third switching transistor to which a light emitting signal is supplied to the gate electrode, a high potential driving voltage is supplied to the drain electrode, and the source electrode is connected to the drain electrode of the driving transistor; a fourth switching transistor to which the light emitting signal is supplied to a gate electrode, a drain electrode is connected to the source electrode of the driving transistor, and a source electrode is connected to an anode electrode of the light emitting element; a fifth switching transistor to which a third scan signal is supplied to a gate electrode, a stabilization voltage is supplied to a drain electrode, and a source electrode is connected to the gate electrode of the driving transistor and the storage capacitor; and a sixth switching transistor to which a fourth scan signal is supplied to a gate electrode, a reset voltage is supplied to a drain electrode, and a source electrode is connected to the anode electrode of the light emitting element.

In the display device according to an embodiment of the present disclosure, the plurality of switching transistors include a first switching transistor to which a first scan signal is supplied to a gate electrode, a drain electrode is connected to a gate electrode of the driving transistor, and a source electrode is connected to a source electrode of the driving transistor; a second switching transistor to which a second scan signal is supplied to a gate electrode, a data voltage is supplied to a drain electrode, and a source electrode is connected to a drain electrode of the driving transistor; a third switching transistor to which a light emitting signal is supplied to a gate electrode, a high potential driving voltage is supplied to a drain electrode, and a source electrode is connected to the drain electrode of the driving transistor; a fourth switching transistor to which the light emitting signal is supplied to a gate electrode, a drain electrode is connected to the source electrode of the driving transistor, and a source electrode is connected to an anode electrode of the light emitting element; a fifth switching transistor to which a third scan signal is supplied to a gate electrode, a stabilization voltage is supplied to a drain electrode, and a source electrode is connected to the gate electrode of the driving transistor and the storage capacitor; a sixth switching transistor to which a fourth scan signal is supplied to a gate electrode, a reset voltage is supplied to a drain electrode, and a source electrode is connected to the anode electrode of the light emitting element; and a seventh switching transistor to which a fifth scan signal is supplied to a gate electrode, the bias voltage is supplied to a drain electrode, and a source electrode is connected to the drain electrode of the driving transistor.

In the display device according to an embodiment of the present disclosure, the bias voltage is supplied between a compensating period for the characteristic value of the driving transistor and a light emitting period of the light emitting element in the first period.

In the display device according to an embodiment of the present disclosure, the bias voltage is supplied to the driving transistor in a second period in which the data voltage is not supplied to the display panel after the first period at the low speed mode which the display panel is driven at the low speed driving frequency.

In the display device according to an embodiment of the present disclosure, the bias voltage supplied in the first period and the bias voltage supplied to the second period have different levels.

In the display device according to an embodiment of the present disclosure, the level of the stabilization voltage or the reset voltage is controlled in a second period in which the data voltage is not supplied to the display panel after the first period in the low speed mode which the display panel is driven at the low speed driving frequency.

In the display device according to an embodiment of the present disclosure, the stabilization voltage is determined according to a level or grayscale of the data voltage supplied to the display panel in the first period.

In the display device according to an embodiment of the present disclosure, the reset voltage is determined according to a level of a low potential driving voltage supplied to a cathode electrode of the light emitting element in the first period.

A display driving method according to an embodiment of the present disclosure for driving a display panel including a light emitting element, a driving transistor for providing a driving current to the light emitting element, and a plurality of switching transistors for controlling an operation of the driving transistor includes switching from a first mode driven at a high speed driving frequency to a second mode driven at a low speed driving frequency; supplying a first bias voltage to the driving transistor in a first period in which a data voltage is supplied to the display panel in the second mode; and supplying a second bias voltage to the driving transistor in a second period in which the data voltage is not supplied to the display panel after the first period.

According to embodiments of the present disclosure, it is possible to provide a display device and a display driving method capable of reducing defects of image quality occurring in the process of changing the driving frequency.

In addition, according to embodiments of the present disclosure, it is possible to provide a display device and a display driving method capable of reducing defects of image quality by applying a bias voltage to prevent a luminance degradation of a light emitting element at a time when a driving frequency is changed from a high speed driving frequency to a low speed driving frequency.

In addition, according to embodiments of the present disclosure, it is possible to provide a display device and a display driving method capable of reducing defects of image quality by controlling the level of a stabilization voltage applied to a driving transistor at a time when the driving frequency is changed from a high speed driving frequency to a low speed driving frequency.

In addition, according to embodiments of the present disclosure, it is possible to provide a display device and a display driving method capable of reducing defects of image quality by controlling the level of a reset voltage applied to a light emitting element at a time when the driving frequency is changed from a high speed driving frequency to a low speed driving frequency.

The effects of the embodiments disclosed in the present disclosure are not limited to the above mentioned effects. In addition, the embodiments disclosed in the present disclosure may cause another effect not mentioned above, which will be clearly understood by those skilled in the art from the following description.

DETAILED DESCRIPTION

Figure 1:
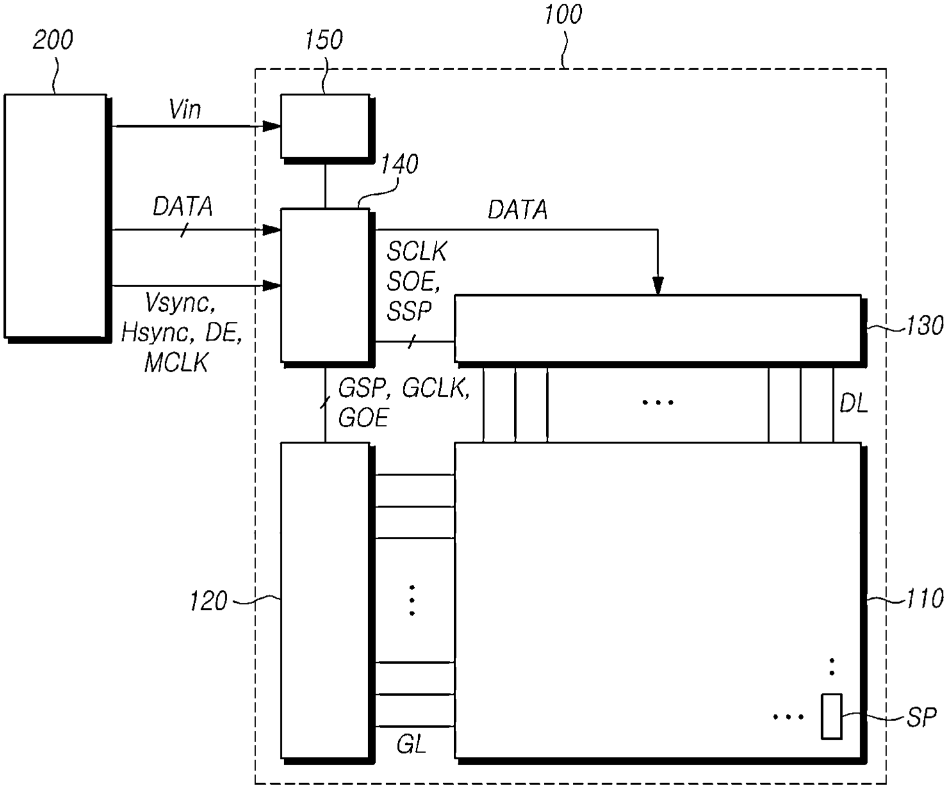
FIG. 1 illustrates a schematic diagram of a display device according to embodiments of the present disclosure.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in a variety of different forms. Rather, these embodiments are provided so that the present disclosure will be thorough and complete, and will fully convey the scope of the present disclosure to those having ordinary knowledge in the technical field. The scope of the present disclosure shall be defined by the appended claims.

The shapes, sizes, ratios, angles, numbers, and the like, inscribed in the drawings to illustrate exemplary embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms “comprise”, “include”, “have”, and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

When spatially relative terms, such as “on”, “above”, “under”, “below”, and “on a side of”, are used herein for descriptions of relationships between one element or component and another element or component, one or more intervening elements or components may be present between the one and other elements or components, unless a term, such as “directly”, is used.

When temporally relative terms, such as “after”, “subsequent”, “following”, and “before” are used to define a temporal relationship, a non-continuous case may be included unless the term “immediately” or “directly” is used.

In descriptions of signal transmission, such as “a signal is sent from node A to node B”, a signal may be sent from node A to node B via another node unless the term “immediately” or “directly” is used.

In addition, terms, such as “first” and “second” may be used herein to describe a variety of components. It should be understood, however, that these components are not limited by these terms. These terms are merely used to discriminate one element or component from other elements or components. Thus, a first component referred to as first hereinafter may be a second component within the spirit of the present disclosure.

The features of exemplary embodiments of the present disclosure may be partially or entirely coupled or combined with each other and may work in concert with each other or may operate in a variety of technical methods. In addition, respective exemplary embodiments may be carried out independently or may be associated with and carried out in concert with other embodiments.

Hereinafter, a variety of embodiments will be described in detail with reference to the accompanying drawings”.

FIG. 1 illustrates a schematic diagram of a display device according to embodiments of the present disclosure.

Referring to FIG. 1, the display device 100 according to embodiments of the present disclosure may include a display panel 110 connected to a plurality of gate lines GL and a plurality of data lines DL in which a plurality of subpixels SP are arranged in rows and columns, a gate driving circuit 120 for supplying scan signals to the plurality of gate lines GL and a data driving circuit 130 for supplying data voltages to the plurality of data lines DL, a timing controller 140 for controlling the gate driving circuit 120 and the data driving circuit 130, and a power management circuit 150.

The display panel 110 displays an image based on the scan signals supplied from the gate driving circuit 120 through the plurality of gate lines GL and the data voltages supplied from the data driving circuit 130 through the plurality of data lines DL.

In the case of a liquid crystal display, the display panel 110 includes a liquid crystal layer formed between two substrates, and TN (twisted nematic) mode, VA (vertical alignment) mode, IPS (in plane switching) mode, FFS (fringe field switching) mode may be operated in any known mode. In the case of an organic light emitting display device, the display panel 110 may be implemented in a top emission method, a bottom emission method, or a dual emission method.

In the display panel 110, a plurality of pixels may be disposed in a matrix form. Each pixel may be composed of subpixels SP of different colors, for example, a white subpixel, a red subpixel, a green subpixel, and a blue subpixel. Each subpixel SP may be defined by the plurality of the data lines DL and the plurality of the gate lines GL.

A subpixel SP may include a thin film transistor (TFT) arranged in a region where a data line DL and a gate line GL intersect, a light emitting element such as a light emitting diode which is emitted according to the data voltage, and a storage capacitor for maintaining the data voltage by being electrically connected to the light emitting element.

For example, when the display device 100 having a resolution of 2,160×3,840 includes four subpixels SP of white W, red R, green G, and blue B, 3,840×4=15,360 data lines DL may be provided by 2,160 gate lines GL and 3,840 data lines DL respectively connected to 4 subpixels WRGB. Each of the plurality of subpixels SP may be disposed in areas in which the plurality of gate lines GL overlap the plurality of data lines DL.

The gate driving circuit 120 is controlled by the timing controller 140, and controls the driving timing of the plurality of subpixels SP by sequentially supplying the scan signals to the plurality of gate lines GL disposed in the display panel 110.

In the display device 100 having a resolution of 2,160×3,840, an operation of sequentially supplying the scan signals to the 2,160 gate lines GL from the first gate line GL1 to the 2,160th gate line GL2160 may be referred to as 2,160-phase driving operation. Otherwise, an operation of sequentially supplying the scan signals to every four gate lines GL, as in a case in which the scan signals are supplied sequentially from first gate line GL1 to fourth gate lines GLA, and then are supplied sequentially from fifth gate line GL5 to eighth gate line GL8, may be referred to as 4-phase driving operation. As described above, an operation in which the scan signals are supplied sequentially to every N number of gate lines may be referred as N-phase driving operation.

The gate driving circuit 120 may include one or more gate driving integrated circuits (GDIC), which may be disposed on one side or both sides of the display panel 110 depending on the driving method. Alternatively, the gate driving circuit 120 may be implemented in a gate-in-panel (GIP) structure embedded in a bezel area of the display panel 110.

The data driving circuit 130 receives digital image data DATA from the timing controller 140, and converts the received digital image data DATA into an analog data voltage. Then, the data driving circuit 130 supplies the analog data voltage to each of the data lines DL at time which the scan signal is supplied through the gate line GL, so that each of the subpixels SP connected to the data lines DL emits light with a corresponding luminance in response to the analog data voltage.

Likewise, the data driving circuit 130 may include one or more source driving integrated circuits (SDIC). Each of the source driving integrated circuits SDIC may be connected to a bonding pad of the display panel 110 by a tape automated bonding (TAB) or a chip on glass (COG), or may be directly mounted on the display panel 110.

In some cases, each of the source driving integrated circuits (SDIC) may be integrated with the display panel 110. In addition, each of the source driving integrated circuits (SDIC) may be implemented with a chip on film (COF) structure. In this case, the source driving integrated circuit SDIC may be mounted on circuit film to be electrically connected to the data lines DL in the display panel 110 via the circuit film.

The timing controller 140 supplies various control signals to the gate driving circuit 120 and the data driving circuit 130, and controls the operations of the gate driving circuit 120 and the data driving circuit 130. That is, the timing controller 140 controls the gate driving circuit 120 to supply the scan signals in response to a time realized by respective frames, and on the other hand, transmits the image data DATA from an external source to the data driving circuit 130.

Here, the timing controller 140 receives various timing signals, including a vertical synchronization signal Vsync, a horizontal synchronization signal Hsync, a data enable signal DE, and a main clock MCLK, from an external host system 200.

The host system 200 may be any one of a TV (television) system, a set-top box, a navigation system, a personal computer (PC), a home theater system, a mobile device, and a wearable device.

Accordingly, the timing controller 140 generates control signals using the various timing signals received from the external source, and supplies the control signals to the gate driving circuit 120 and the data driving circuit 130.

For example, the timing controller 140 generates various gate control signals, including a gate start pulse GSP, a gate clock GCLK, and a gate output enable signal GOE, to control the gate driving circuit 120. Here, the gate start pulse GSP is used to control the start timing of one or more gate driving integrated circuits GDIC of the gate driving circuit 120. In addition, the gate clock GCLK is a clock signal commonly supplied to the one or more gate driving integrated circuits GDIC for controlling the shift timing of the scan signals. The gate output enable signal GOE designates timing information of the one or more gate driving integrated circuits GDIC.

In addition, the timing controller 140 generates various data control signals, including a source start pulse SSP, a source sampling clock SSC, and a source output enable signal SOE, to control the data driving circuit 130. Here, the source start pulse SSP is used to control the start timing for the data sampling of one or more source driving integrated circuits SDIC of the data driving circuit 130. The source sampling clock SSC is a clock signal for controlling a timing of data sampling in each of the source driving integrated circuits SDIC. The source output enable signal SOE controls the output timing of the data driving circuit 130.

The display device 100 may further include a power management circuit 150 for supplying or controlling various voltage or current to the display panel 110, the gate driving circuit 120, and the data driving circuit 130.

The power management circuit 150 generates a necessary power to drive the display panel 100, the gate driving circuit 120, and the data driving circuit 130 by controlling a DC input voltage Vin supplied from the host system 200.

The subpixel SP is positioned at a point where the gate line GL and the data line DL intersect and a light emitting element may be disposed in each of the subpixels SP. For example, the organic light emitting display device may include a light emitting element, such as a light emitting diode in each of the subpixels SP, and may display an image by controlling current flowing through the light emitting elements in response to the data voltage.

The display device 100 may be various types of devices such as a liquid crystal display, an organic light emitting display, and a plasma display panel.

Figure 2:
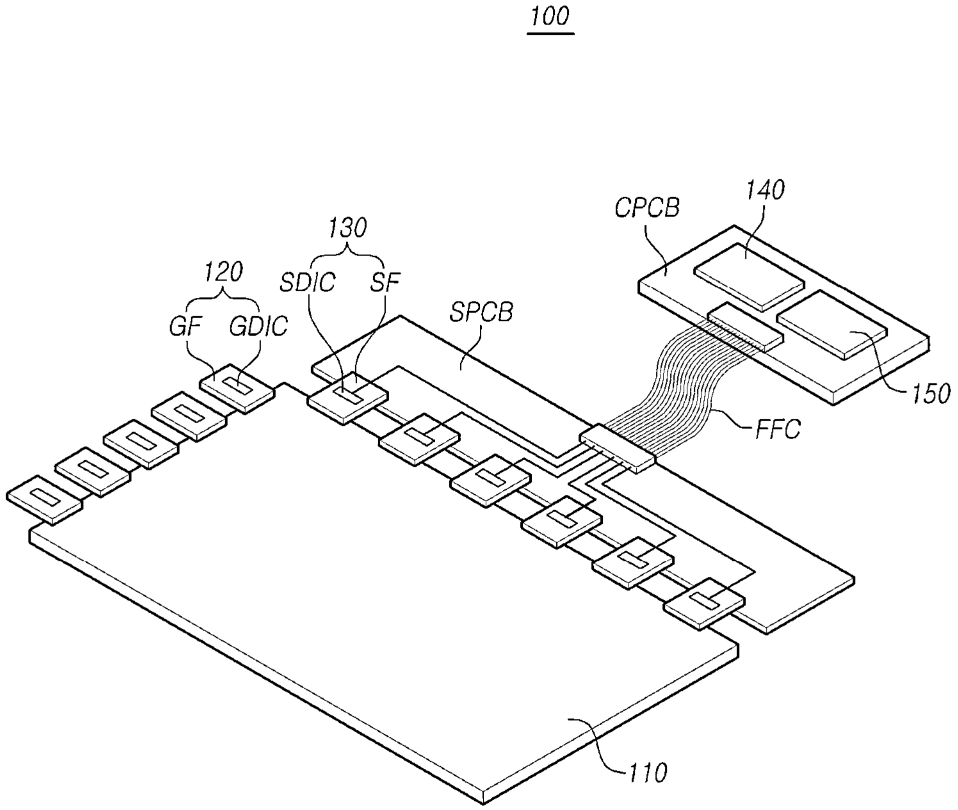
FIG. 2 illustrates a system diagram of the display device according to embodiments of the present disclosure.

FIG. 2 illustrates a system diagram of the display device according to embodiments of the present disclosure.

As an example, FIG. 2 illustrates that each of the source driving integrated circuits SDIC of the data driving circuit 130 and each of the gate driving integrated circuits GDIC of the gate driving circuit 120 in the display device 100 according to embodiments of the present disclosure are implemented with a COF type among various structures among various structures such as a TAB, a COG, and a COF.

One or more gate driving integrated circuits GDIC included in the gate driving circuit 120 may be respectively mounted on the gate film GF, and one side of the gate film GF may be electrically connected to the display panel 110. Also, electrical lines may be disposed on the gate film GF to electrically connect the gate driving integrated circuit GDIC and the display panel 110.

Likewise, the data driving circuit 130 may include one or more source driving integrated circuits SDIC, which may be mounted on a source film SF, respectively. One portion of the source film SF may be electrically connected to the display panel 110. In addition, electrical lines may be disposed on the source films SF to electrically connect the source driving integrated circuits SDIC and the display panel 110.

The display device 100 may include at least one source printed circuit board SPCB in order to connect the plurality of source driving integrated circuits SDIC to other devices by electrical circuit, and a control printed circuit board CPCB in order to mount various control components and electric elements.

The other portion of the source film SF, on which the source driving integrated circuit SDIC is mounted, may be connected to the at least one source printed circuit board SPCB. That is, one portion of source film SF on which the source driving integrated circuit SDIC is mounted may be electrically connected to the display panel 110, and the other portion of the source film SF may be electrically connected to the source printed circuit board SPCB.

The timing controller 140 and a power management circuit 150 may be mounted on the control printed circuit board CPCB. The timing controller 140 may control the operations of the data driving circuit 130 and the gate driving circuit 120. The power management integrated circuit 150 may supply a driving voltage and a driving current, or control a voltage and a current for the data driving circuit 130 and the gate driving circuit 120.

At least one source printed circuit board SPCB and the control printed circuit board CPCB may have circuitry connection by at least one connecting member. The connecting member may be, for example, a flexible printed circuit FPC, a flexible flat cable FFC, or the like. In this case, the connecting member to connecting at least one source printed circuit board SPCB and the control printed circuit board CPCB may be variously changed according to the size and type of the display device 100. At least one source printed circuit board SPCB and the control printed circuit board CPCB may be integrated into a single printed circuit board.

In the display device 100 having the above described configuration, the power management circuit 150 supplies the driving voltage, which is required for a display driving operation or a sensing operation of the characteristic value, to the source printed circuit board SPCB through the flexible printed circuit FPC or the flexible flat cable FFC. The driving voltage supplied to the source printed circuit board SPCB, is transmitted to emit or sense a specific subpixel SP in the display panel 110 via the source driving integrated circuits SDIC.

Each of the subpixels SP arranged in the display panel 110 of the display device 100 may include an organic light emitting diode as a light emitting element and circuit elements, such as a driving transistor to drive it.

The type and number of the circuit elements constituting each of the subpixels SP may be variously determined depending on the function, the design, or the like.

Figure 3:
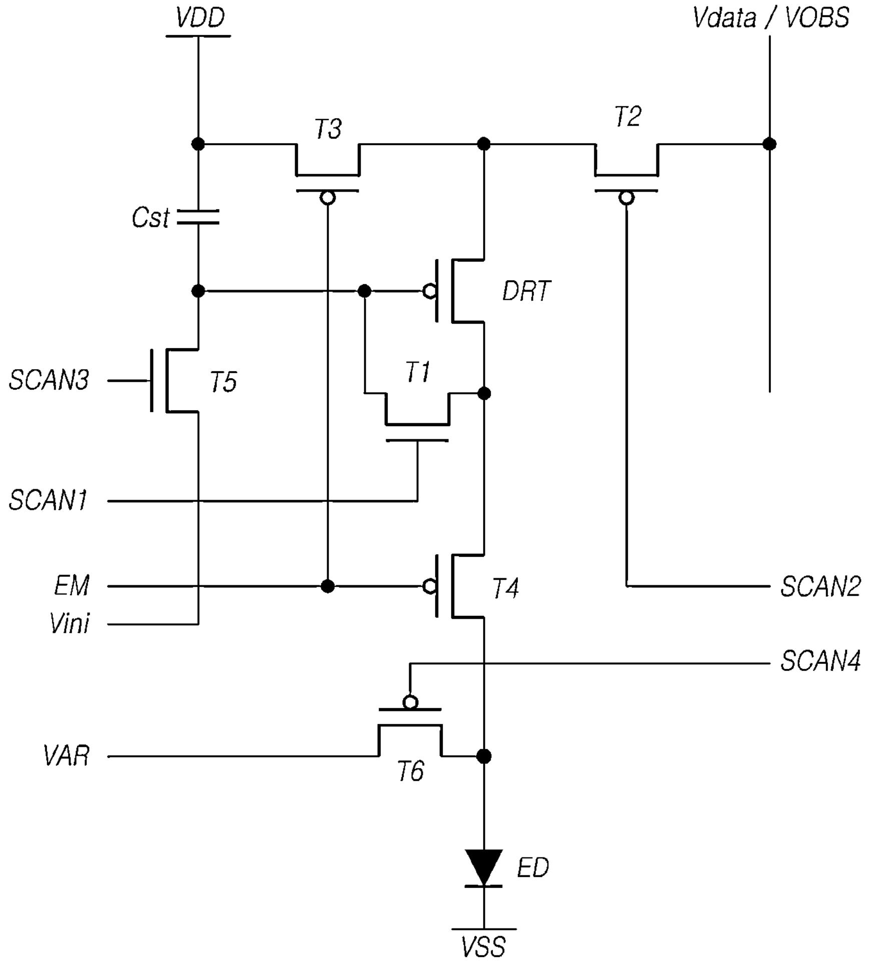
FIG. 3 illustrates a diagram of a subpixel circuit of the display device according to an embodiment of the present disclosure.

FIG. 3 illustrates a diagram of a subpixel circuit of the display device according to an embodiment of the present disclosure.

Referring to FIG. 3, a subpixel SP of the display device 100 according to an embodiment of the present disclosure includes first to sixth switching transistors T1 to T6, a driving transistor DRT, a storage capacitor Cst, and a light emitting element ED.

Here, the light emitting element ED may be, for example, a self-emissive element capable of emitting light by itself, such as an organic light emitting diode OLED.

In the subpixel SP according to an embodiment of the present disclosure, the second to fourth switching transistors T2 to T4, the sixth switching transistor T6, and the driving transistor DRT may be P-type transistors. Also, the first switching transistor T1 and the fifth switching transistor T5 may be N-type transistors.

The P-type transistor is relatively more reliable than the N-type transistor. The P-type transistor has an advantage that the current flowing through the light emitting element ED is not influenced by the storage capacitor Cst since the drain electrode is fixed to the high potential driving voltage VDD. Therefore, the current tends to be supplied stably.

For example, the P-type transistor may be connected to the anode electrode of the light emitting element ED. At this time, a constant current can flow regardless of changes in the current and threshold voltage of the light emitting element ED when the transistors T4, T6 connected to the light emitting element ED operate in a saturation region. So, reliability is relatively high.

In this subpixel SP structure, the N-type transistors T1, T5 may be oxide transistors formed using a semiconducting oxide (for example, transistors with a channel formed from a semiconducting oxide such as indium, gallium, zinc oxide or IGZO), and other P-type transistors DRT, transistors T2 to T4, and transistor T6 may be silicon transistors formed from semiconductors such as silicon (for example, transistors with a polysilicon channel formed by low temperature process like LTPS or low temperature polysilicon).

The oxide transistor has a relatively low leakage current than the silicon transistor. Therefore, when it is implemented using the oxide transistor, leakage current from the gate electrode of the driving transistor DRT is reduced, and there is an effect that can reduce the defect of image quality like flicker.

Meanwhile, the remaining P-type transistors DRT, transistors T2 to T4, transistor T6 except for the first switching transistor T1 and the fifth switching transistor T5 corresponding to the N-type transistor may be made of low temperature polysilicon.

A first scan signal SCAN1 is supplied to the gate electrode of the first switching transistor T1. A drain electrode of the first switching transistor T1 is connected to a gate electrode of the driving transistor DRT.

A source electrode of the first switching transistor T1 is connected to a source electrode of the driving transistor DRT.

The first switching transistor T1 is turned on by the first scan signal SCAN1, and controls the operation of the driving transistor DRT using a high potential driving voltage VDD stored in the storage capacitor Cst.

The first switching transistor T1 may be formed of an N-type MOS transistor to constitute an oxide transistor. Since the N-type MOS transistor uses electrons as carriers, it has higher mobility and fast switching speed than the P-type MOS transistor.

A second scan signal SCAN2 is supplied to the gate electrode of the second switching transistor T2. Data voltage Vdata or bias voltage VOBS may be supplied to the drain electrode of the second switching transistor T2. A source electrode of the second switching transistor T2 is connected to a drain electrode of the driving transistor DRT.

The second switching transistor T2 is turned on by the second scan signal SCAN2 to supply the data voltage Vdata to the drain electrode of the driving transistor DRT.

A light emitting signal EM is supplied to the gate electrode of the third switching transistor T3. The high potential driving voltage VDD is supplied to a drain electrode of the third switching transistor T3. A source electrode of the third switching transistor T3 is connected to a drain electrode of the driving transistor DRT.

The third switching transistor T3 is turned on by the light emitting signal EM to supply the high potential driving voltage VDD to the drain electrode of the driving transistor DRT.

The light emitting signal EM is supplied to the gate electrode of the fourth switching transistor T4. A drain electrode of the fourth switching transistor T4 is connected to a source electrode of the driving transistor DRT. A source electrode of the fourth switching transistor T4 is connected to an anode electrode of the light emitting element ED.

The fourth switching transistor T4 is turned on by the light emitting signal EM to supply a driving current to the anode electrode of the light emitting element ED.

A third scan signal SCAN3 is supplied to a gate electrode of the fifth switching transistor T5.

Here, the third scan signal SCAN3 may be the first scan signal SCAN1 supplied to a subpixel SP at another position. For example, when the first scan signal SCAN1 is supplied to nth gate line, the third scan signal SCAN3 may be the first scan signal SCAN1[n-9] supplied to (n-9)th gate line. That is, the third scan signal SCAN3 may be used as the first scan signal SCAN1 at another gate line GL according to a driving phase of the display panel 110.

A stabilization voltage Vini is supplied to a drain electrode of the fifth switching transistor T5. A source electrode of the fifth switching transistor T5 is connected to a gate electrode of the driving transistor DRT and the storage capacitor Cst.

The fifth switching transistor T5 is turned on by the third scan signal SCAN3 to supply the stabilization voltage Vini to the gate electrode of the driving transistor DRT.

A fourth scan signal SCAN4 is supplied to a gate electrode of the sixth switching transistor T6.

Here, the fourth scan signal SCAN4 may be the second scan signal SCAN2 supplied to a subpixel SP at another position. For example, when the second scan signal SCAN2 is supplied to nth gate line, the fourth scan signal SCAN4 may be the second scan signal SCAN2[n-1] supplied to (n-1)th gate line. That is, the fourth scan signal SCAN4 may be used as the second scan signal SCAN2 at another gate line GL according to a driving phase of the display panel 110.

A reset voltage VAR is supplied to the drain electrode of the sixth switching transistor T6. The source electrode of the sixth switching transistor T6 is connected to the anode electrode of the light emitting element ED.

The sixth switching transistor T6 is turned on by the fourth scan signal SCAN4 to supply the reset voltage VAR to the anode electrode of the light emitting element ED.

The gate electrode of the driving transistor DRT is connected to the drain electrode of the first switching transistor T1. The drain electrode of the driving transistor DRT is connected to the source electrode of the second switching transistor T2. The source electrode of the driving transistor DRT is connected to the source electrode of the first switching transistor T1.

The driving transistor DRT is turned on by the voltage difference between the source electrode and the drain electrode of the first switching transistor T1 to supply a driving current to the light emitting element ED.

A high potential driving voltage VDD is supplied to one side of the storage capacitor Cst and the other side of the storage capacitor Cst is connected to the gate electrode of the driving transistor DRT. The storage capacitor Cst stores a voltage of the gate electrode of the driving transistor DRT.

The anode electrode of the light emitting element ED is connected to the source electrode of the fourth switching transistor T4 and the source electrode of the sixth switching transistor T6. A low potential driving voltage VSS is supplied to a cathode electrode of the light emitting element ED.

The light emitting element ED emits light with a predetermined luminance due to the driving current controlled by the driving transistor DRT.

At this time, the stabilization voltage Vini is supplied to stabilize the change of the capacitance formed in the gate electrode of the driving transistor DRT. The reset voltage VAR is supplied to reset the anode electrode of the light emitting element ED.

When the reset voltage VAR is supplied to the anode electrode of the light emitting element ED in a state that the fourth switching transistor T4 is turned off, the anode electrode of the light emitting element ED can be reset.

The sixth switching transistor T6 for supplying the reset voltage VAR is connected to the anode electrode of the light emitting element ED.

In order for the driving operation of the driving transistor DRT and the resetting operation of the anode electrode of the light emitting element ED to be separately performed, the third scan signal SCAN3 for driving or resetting the driving transistor DRT and the fourth scan signal SCAN4 for controlling the supply of the reset voltage VAR to the anode electrode of the light emitting element ED are separated from each other.

When the switching transistors T5, T6 for supplying the stabilization voltage Vini and the reset voltage VAR are turned on, the fourth switching transistor T4 which connects the source electrode of the driving transistor DRT to the anode electrode of the light emitting element ED may be turned off. As a result, the driving current of the driving transistor DRT is blocked so as not to flow to the anode electrode of the light emitting element ED, so that the anode electrode is not affected by voltages other than the reset voltage VAR.

As described above, the subpixel SP including the seven transistors DRT, T1, T2, T3, T4, T5, T6 and one capacitor Cst may be referred to as a 7T1C structure.

Here, the 7T1C structure is shown as an example among various type of subpixel SP circuits. The structure and number of transistors and capacitors constituting the subpixel SP may be variously changed. Meanwhile, each of the plurality of subpixels SP may have the same structure, or some of the plurality of subpixels SP may have different structures.

Figure 4:
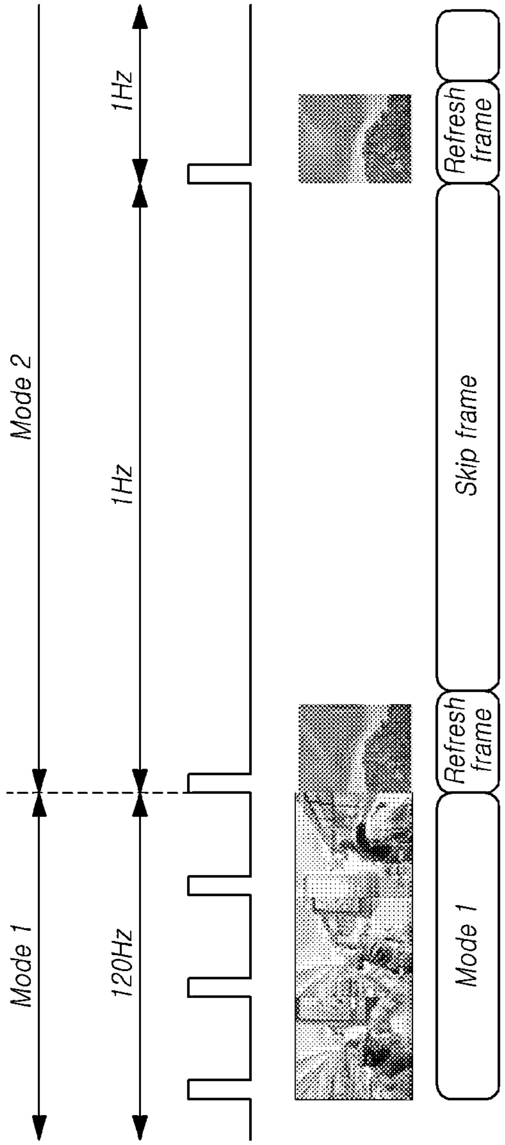
FIG. 4 illustrates a schematic diagram of driving modes based on frequency changes in a display device according to an embodiment of the present disclosure.

FIG. 4 illustrates a schematic diagram of driving modes based on frequency changes in a display device according to an embodiment of the present disclosure.

Referring to FIG. 4, the display device 100 according to an embodiment of the present disclosure may include a first mode Mode 1 in which moving image data are displayed at a high speed first frequency and a second mode Mode 2 in which still image data or low speed image data are displayed at a low speed second frequency.

For example, in the first mode Mode 1, moving image data may be displayed on the display panel 110 in full color at a frequency of 120 Hz corresponding to the first frequency. While the display device 100 is operated in the first mode Mode 1, the subpixels SP of the display panel 110 display moving image data transmitted from the timing controller 140 for every 120 frame periods.

As described above, a period in which image data are continuously displayed on the display panel 110 at a high speed driving frequency may be referred to as a refresh frame. For example, when the driving frequency is 120 Hz, all 120 frames for 1 second in the first mode Mode 1 will be refresh frames in which image data are displayed.

Meanwhile, when the display device 100 is operated in the second mode Mode 2 in which still image data or low speed image data are displayed, the display device 100 may display a designated image data in an initial period of the second mode Mode 2 on the display panel 110, and may not display the image data on the display panel 110 for the remaining period.

For example, when entering the second mode Mode 2, the display device 100 may change the driving frequency from the first frequency of 120 Hz to the second frequency of 1 Hz. At this time, the image data displayed in the last period of the first mode Mode 1 may be displayed on the display panel 110 in the second mode Mode 2 changed to a frequency of 1 Hz.

For example, in the second mode Mode 2 driven at 1 Hz, the display device 100 may display the image data displayed in the last frame of the first mode Mode 1 on the display panel 110 once, and may not display the image data during the remaining time.

In this case, the subpixel SP may display the image data once in the second mode Mode 2, but may maintain the voltage stored in the storage capacitor Cst for the remaining time. As described above, a period in which the voltage stored in the storage capacitor Cst is maintained without transmitting image data to the display panel 110 may be referred to as a skip frame. For example, when the driving frequency is 120 Hz, the first frame of the second mode Mode 2 will be a refresh frame in which image data are displayed, and the remaining frames are skip frames in which image data are not transmitted.

As described above, power consumption may be reduced by not transmitting image data for a certain period (skip frame) in the second mode Mode 2 driven at low speed frequency.

However, in the process of switching from the first mode Mode 1 driven at the high speed frequency to the second mode Mode 2 driven at the low speed frequency, a flicker phenomenon due to the luminance deviation may occur.

Figure 5:
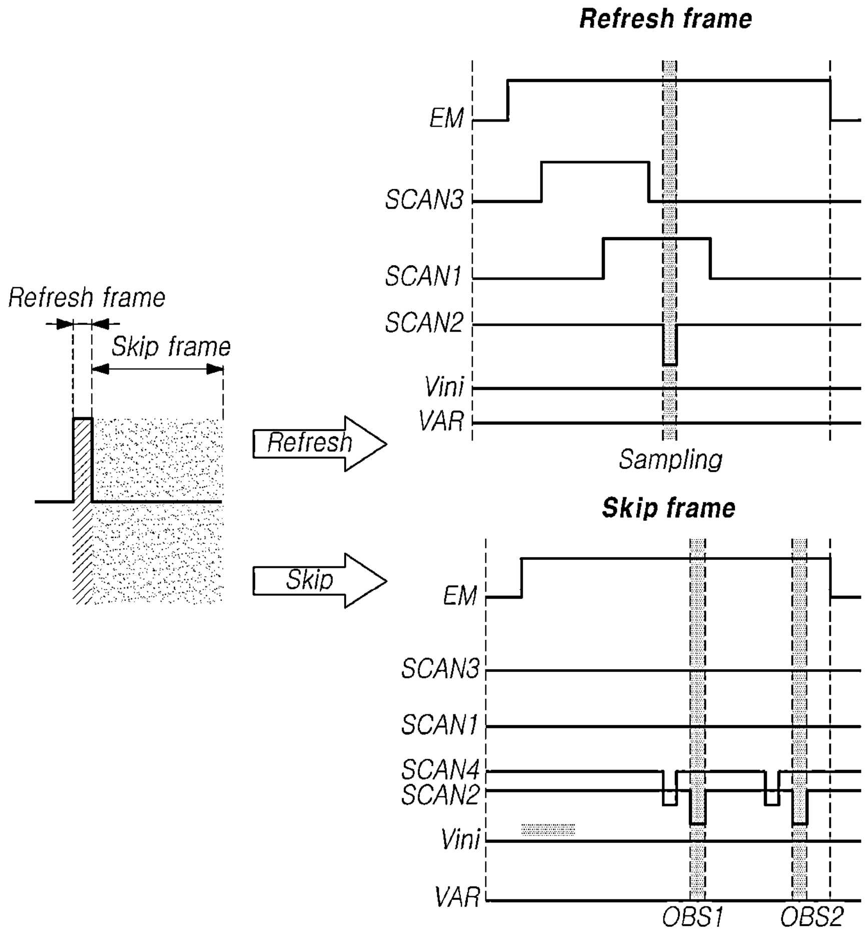
FIG. 5 illustrates a driving timing in a second mode driven at a low speed frequency in the display device according to an embodiment of the present disclosure.

FIG. 5 illustrates a driving timing in a second mode driven at a low speed frequency in the display device according to an embodiment of the present disclosure.

Referring to FIG. 5, the second mode Mode 2 driven at a low speed frequency in the display device 100 according to an embodiment of the present disclosure may include a first period and a second period which are divided from one frame period based on a synchronization signal SYNC.

The first period may be a refresh frame in which image data are displayed, and the second period may be a skip frame in which image data are not transmitted.

A data voltage Vdata for driving the subpixel SP, a stabilization voltage Vini, and a reset voltage VAR may be supplied at the refresh frame.

A refresh frame is a period for initializing the voltage charged or remaining in the storage capacitor Cst and the driving transistor DRT. A refresh frame may be partially provided in the start period of each frame in the low speed second mode Mode 2. Effects of the data voltage Vdata and the driving voltage stored in the subpixel SP in the high speed first mode Mode 1 may be removed in the refresh frame.

After the refresh operation is completed within the refresh frame, the light emitting element ED may emit light according to the data voltage Vdata supplied to the subpixel SP.

Meanwhile, a sampling process "Sampling" for compensating for a characteristic value (threshold voltage or mobility) of the driving transistor DRT may be performed within the refresh frame.

For example, when the first switching transistor T1 is turned on by the first scan signal SCAN1 to electrically connect the gate electrode and the source electrode of the driving transistor DRT, the gate electrode and the source electrode of the driving transistor DRT have substantially equal potentials. At this time, when the second switching transistor T2 is turned on by the second scan signal SCAN2 to supply the data voltage Vdata, it forms a current path until the voltage difference Vgs between the gate electrode and the source electrode of the driving transistor DRT reaches the threshold voltage of the driving transistor DRT. Accordingly, the voltages of the gate electrode and the source electrode of the driving transistor DRT are charged.

That is, when the data voltage Vdata is supplied to the drain electrode of the driving transistor DRT, the voltages of the gate electrode and the source electrode of the driving transistor DRT rise to a voltage difference between the data voltage and the threshold voltage. Due to this, the threshold voltage of the driving transistor DRT may be compensated.

As described above, the process of compensating for the characteristic value of the driving transistor DRT by the sampling process may correspond to internal compensation.

The skip frame is a period for charging or setting the data voltage Vdata and the driving voltage of each frame. The skip frame continues until the refresh frame of the next frame starts after the refresh frame is completed in each frame.

In the skip frame, the driving transistor DRT and the light emitting element ED are driven according to the scan signal SCAN and the light emitting signal EM. That is, the initialization operation and supply of the data voltage Vdata may be performed in a refresh frame of one frame period, and the light emitting element ED may emit light in a skip frame.

In the skip frame, the anode electrode of the light emitting element ED is reset to the reset voltage VAR. In this case, the anode electrode of the light emitting element ED may be reset to a predetermined voltage in order to improve flicker generated while the skip frame is continued by low speed driving operation in the skip frame.

Specifically, the data voltage Vdata in the skip frame maintains a low logic level L. Meanwhile, in order to reduce a hysteresis effect that may occur in the driving transistor DRT and improve response characteristic, a bias voltage VOBS may be supplied in the skip frame. For example, the driving transistor DRT may be in an on-bias state through which a large current flows between the drain electrode and the source electrode of the driving transistor DRT by supplying a peak white grayscale voltage to the gate electrode of the driving transistor DRT.

On the other hand, the driving transistor DRT may be in an off-bias state through which no current flows between the drain electrode and the source electrode of the driving transistor DRT by supplying a peak black grayscale voltage to the gate electrode of the driving transistor DRT.

The peak white grayscale voltage refers to a voltage supplied to the gate electrode of the driving transistor DRT to emit the light emitting element ED with a peak white grayscale, and the peak black grayscale voltage refers to a voltage supplied to the gate electrode of the driving transistor DRT to emit the light emitting element ED with a peak black grayscale. For example, when a grayscale value is expressed as an 8-bit digital value, the peak black grayscale may mean minimum value "0", and the peak white grayscale may mean maximum value "255".

At this time, since the sweep curves of the on-bias state and the off-bias state in the P-type driving transistor DRT are not same, a current flowing between the drain electrode and the source electrode of the driving transistor DRT in the same grayscale may be different.

At this time, in the gray expression, the current characteristic flowing between the drain electrode and the source electrode of the driving transistor DRT is changed between the on-bias state and the off-bias state due to the voltage deviation between the gate electrode and the source electrode of the driving transistor DRT. Such a phenomenon is called hysteresis, which may cause an afterimage in the display device.

In addition, the difference of driving current flowing through the drain electrode and the source electrode of the driving transistor DRT does not stabilize the driving characteristics of the light emitting element ED, and may cause a luminance deviation.

In particular, when an operation mode of the display device 100 is changed from the first mode Mode 1 driven at a high speed driving frequency to the second mode Mode 2 driven at a low speed driving frequency, the afterimage due to the hysteresis phenomenon can be easily recognized.

Accordingly, while the display device 100 operates in the second mode Mode 2 driven at the low speed driving frequency, on-bias processes OBS1, OBS2 for setting the driving transistor DRT to an on-bias state may be performed before the emitting period starts in order to reduce the recognition of an afterimage due to the hysteresis phenomenon.

For the purpose of the above, the driving transistor DRT may be on-bias state by supplying the bias voltage VOBS to the drain electrode or the source electrode of the driving transistor DRT before the emitting period starts.

For example, the bias voltage VOBS may be supplied to the drain electrode of the transistor DRT through the data line DL before the emitting period starts within a skip frame of the second mode Mode 2 driven at a low speed driving frequency.

Alternatively, the bias voltage VOBS may be supplied to the source electrode of the driving transistor DRT through a separate bias voltage supply line before the emitting period starts within a skip frame of the second mode Mode 2 driven at a low speed driving frequency.

Here, it illustrates a case as an example in which the bias voltage VOBS is supplied to the drain electrode of the transistor DRT through the data line DL before the emitting period starts within a skip frame of the second mode Mode 2 driven at a low speed driving frequency.

The first scan signal SCAN1 and the third scan signal SCAN3 maintain a low logic level L, and the second scan signal SCAN2 and the fourth scan signal SCAN4 maintains a high logic level H in a skip frame.

Accordingly, the data voltage Vdata is not supplied in the skip frame. In addition, the first and fourth switching transistors T1, T4 maintain a turned-off state in a skip frame.

The second scan signal SCAN2 and the fourth scan signal SCAN4 may be supplied to the odd gate line and the even gate line with a phase difference. The second scan signal SCAN2 and the fourth scan signal SCAN4 may maintain a low logic level L in a part of a skip frame and maintain a high logic level H in the remaining period.

The second switching transistor T2 is turned on in a period in which the second scan signal SCAN2 maintains a low logic level L, and the sixth switching transistor T6 is turned on in a period in which the fourth scan signal SCAN4 maintains a low logic level L.

In the skip frame, the second switching transistor T2 of turned-on state supplies the bias voltage VOBS to the driving transistor DRT, and the sixth switching transistor T6 of turned-on state supplies the reset voltage VAR to the anode electrode of the light emitting element ED.

The light emitting signal EM maintains a high logic level H in the skip frame. The third switching transistor T3 and the fourth switching transistor T5 are turned on in the period in which the light emitting signal EM maintains the low logic level L.

Since the light emitting signal EM maintains the high logic level H in a skip frame, the third switching transistor T3 and the fourth switching transistor T4 are turned off. Accordingly, the current of the driving transistor DRT may be cut off while the anode electrode of the light emitting device ED is reset.

Figure 6:
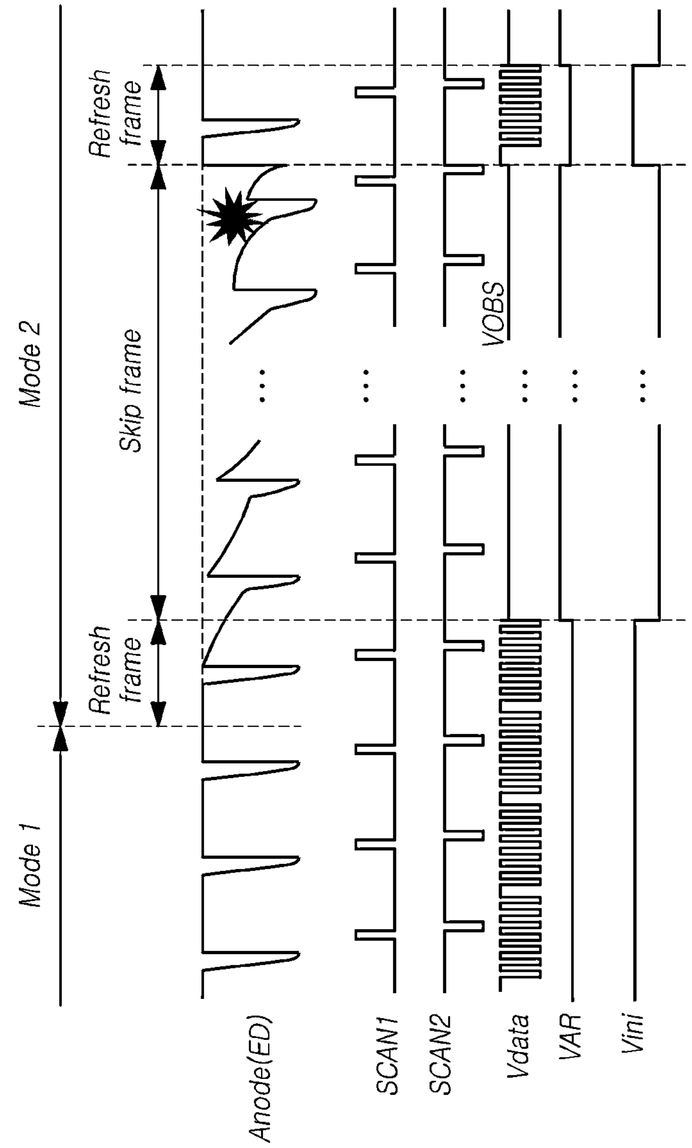
FIG. 6 illustrates a signal diagram of a luminance change when the display device operates at a low driving frequency according to an embodiment of the present disclosure.

FIG. 6 illustrates a signal diagram of a luminance change when the display device operates at a low driving frequency.

Referring to FIG. 6, while the second mode Mode 2 driven at the low speed driving frequency is performed, the data voltage Vdata and the stabilization voltage Vini are supplied in a state in which the third switching transistor T3 and the fourth switching transistor T4 are turned off by the light emitting signal EM of a high logic level H in the refresh frame period. Accordingly, the luminance of the subpixel SP may be momentarily lowered.

After the stabilization voltage Vini and the data voltage Vdata are supplied, the luminance of the subpixel SP increases because the light emitting element ED starts to emit light when the third switching transistor T3 and the fourth switching transistor T4 are turned on by the light emitting signal EM of the low logic level L.

In a period in which the skip frame is in progress after the refresh frame is terminated, the luminance of the subpixel SP may gradually decrease. In particular, since the skip frame is maintained for longer than the refresh frame in the second mode Mode 2 driven at the low speed driving frequency, the amount of luminance degradation of the light emitting element ED may be larger.

Such a luminance change may occur due to a change in the characteristic value of driving transistor DRT when the image data displayed by the display device 100 is changed, for example, from a black image data to a white image data or from a moving image data to a still image data. Accordingly, the luminance deviation between frames increases and a flicker phenomenon may appear during the second mode Mode 2 driven at the low speed driving frequency.

The display device 100 of the present disclosure may reduce defects such as flicker and improve image quality by reducing luminance degradation that appears when the operation mode is changed to a low speed driving frequency. For the purpose of the above, the display device 100 of the present disclosure may supply a bias voltage in a refresh frame period to alleviate hysteresis of the driving transistor DRT in the second mode (Mode 2) operated at a low driving frequency. may additionally authorize FIG. 7A illustrates operation of a subpixel circuit of the display device and FIG. 7B illustrates a signal diagram in the case of reducing luminance degradation by supplying a bias voltage in a refresh frame in the display device according to an embodiment of the present disclosure.

Figure 7A:
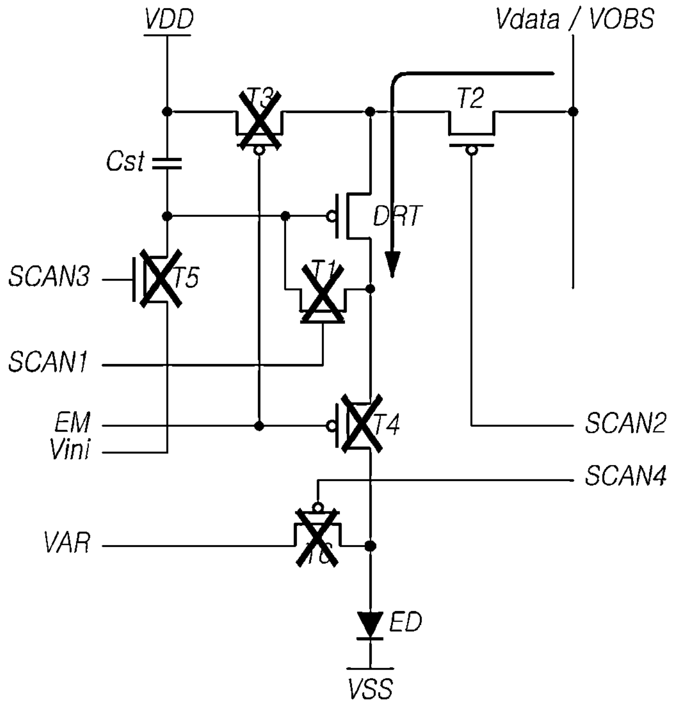
FIG. 7A illustrates operation of a subpixel circuit of the display device and FIG. 7B illustrates a signal diagram in the case of reducing luminance degradation by supplying a bias voltage in a refresh frame in the display device according to an embodiment of the present disclosure.
Figure 7B:
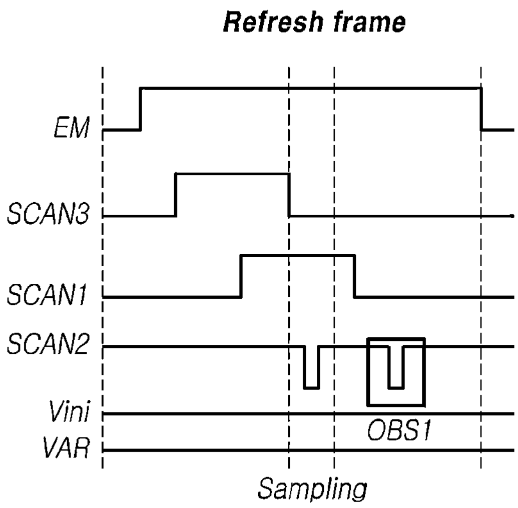

Referring to FIGS. 7A and 7B, the display device 100 according to an embodiment of the present disclosure may perform an on-bias process OBS1 for supplying a bias voltage previously in the refresh frame in order to reduce a flicker phenomenon caused by a luminance deviation of the refresh frame and the skip frame in the second mode Mode 2 driven at a low speed driving frequency.

The second mode Mode 2 driven at a low speed driving frequency may include a refresh frame in which image data are displayed and a skip frame in which image data are not transmitted.

In the refresh frame in which the data voltage Vdata, the stabilization voltage Vini, and the reset voltage VAR for driving the subpixel SP are supplied, an on-bias process OBS1 of supplying the bias voltage VOBS may be additionally performed in order to set the driving transistor DRT to an on-bias state before the light emitting period starts.

Meanwhile, a sampling process Sampling of compensating for a characteristic value (threshold voltage or mobility) of the driving transistor DRT may be performed within the refresh frame.

When the sampling process Sampling is in progress, the on-bias process OBS1 may be performed in a period between the sampling process Sampling and the light emitting period.

At this time, the on-bias process OBS1 within the refresh frame may be performed in a state in which the second switching transistor T2 is turned on, and the remaining switching transistors—the first switching transistor T1, the third switching transistor T3, the fourth switching transistor T4, the fifth switching transistor T5, and the sixth switching transistor T6—are all turned off.

Accordingly, the bias voltage VOBS may be supplied to the drain electrode of the driving transistor DRT during the on-bias process OBS1 in the refresh frame. At this time, when the driving transistor DRT is turned on by the charged capacitance in the storage capacitor Cst, the bias voltage VOBS may be supplied to both the drain electrode and the source electrode of the driving transistor DRT.

As a result, it is possible to reduce the hysteresis of the driving transistor DRT and the luminance degradation of the light emitting element ED in the refresh frame of the second mode Mode 2 driven at a low speed driving frequency.

Figure 8A:
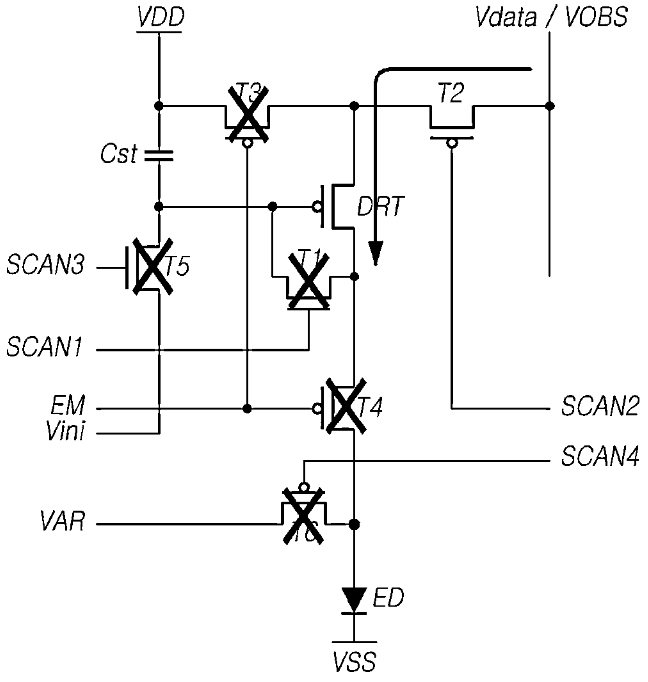
FIG. 8A illustrates operation of a subpixel circuit of the display device and FIG. 8B illustrates a signal diagram in the case of reducing luminance degradation by supplying a bias voltage in a skip frame in the display device according to an embodiment of the present disclosure.
Figure 8B:
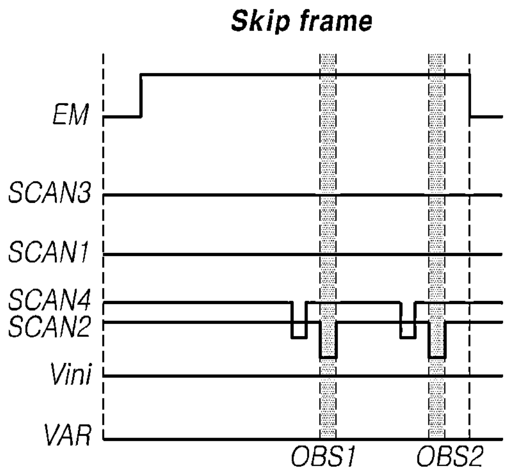

FIG. 8A illustrates operation of a subpixel circuit of the display device and FIG. 8B illustrates a signal diagram in the case of reducing luminance degradation by supplying a bias voltage in a skip frame in the display device according to an embodiment of the present disclosure.

Referring to FIGS. 8A and 8B, the display device 100 according to an embodiment of the present disclosure may supply the bias voltage VOBS to the drain electrode or the source electrode of the driving transistor DRT one or more times to reduce the hysteresis of the driving transistor DRT in the skip frame in which the image data are not transmitted to the display panel 110 and charged voltage in the storage capacitor Cst is maintained after a refresh frame ends.

Here, it illustrates a case that two on-bias processes OBS2, OBS3 are performed in a skip frame. It is the same case as the operation shown in FIG. 5, and further description will be omitted.

Figure 9:
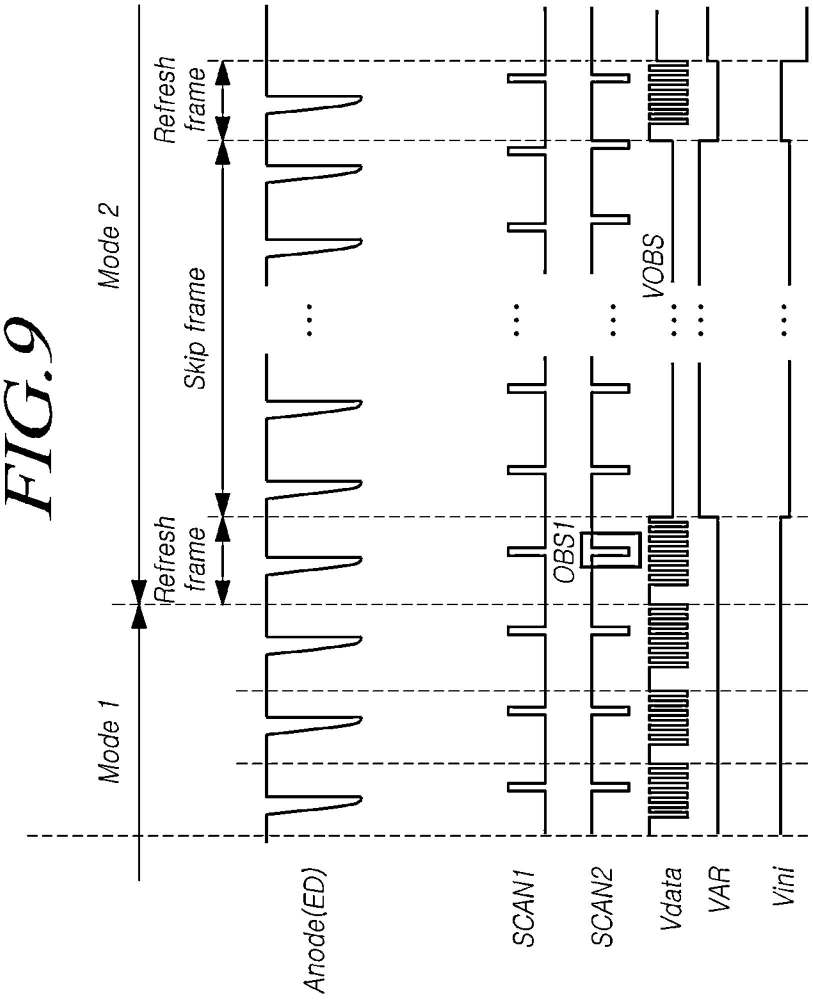
FIG. 9 illustrates a diagram of a case in which a luminance deviation in a skip frame is improved by an on-bias process in a refresh frame in the display device according to an embodiment of the present disclosure.

FIG. 9 illustrates a diagram of a case in which a luminance deviation in a skip frame is improved by an on-bias process in a refresh frame in the display device according to an embodiment of the present disclosure.

Referring to FIG. 9, the display device 100 according to an embodiment of the present disclosure may change an operation mode from a first mode Mode 1 driven at a high speed driving frequency to a second mode Mode 2 driven at a low speed driving frequency according to the type of input image data.

For example, the first mode Mode 1 may be driven at a frequency of 120 Hz, and the second mode Mode 2 may be driven at a frequency of 1 Hz.

While the display device 100 is performed in the second mode Mode 2 driven at the low speed driving frequency, the data voltage Vdata and the stabilization voltage Vini are supplied in a state in which the third switching transistor T3 and the fourth switching transistor T4 are turned off by the light emitting signal EM of a high logic level H in the refresh frame period. Accordingly, the luminance of the subpixel SP may be momentarily lowered.

On the other hand, when a sampling process Sampling of compensating for the characteristic value of the driving transistor DRT is performed in the refresh frame, the voltages of the gate electrode and the source electrode of the driving transistor DRT may be increased to the voltage difference between data voltage Vdata and the threshold voltage. As a result, a shifting phenomenon, which the operating region of the driving transistor DRT moves, may occur.

Accordingly, in the refresh frame of the second mode Mode 2 driven at the low speed driving frequency, the bias voltage VOBS may be supplied to the drain electrode or the source electrode of the driving transistor DRT before the light emitting period starts and after the sampling process Sampling of compensating for the characteristic value of the driving transistor DRT is terminated. As a result, the luminance degradation of the light emitting element ED may be reduced.

Meanwhile, in a period in which the skip frame is in progress after the refresh frame is terminated, the luminance of the subpixel SP may gradually decrease. In particular, since the skip frame is maintained for longer than the refresh frame in the second mode Mode 2 driven at the low speed driving frequency, the amount of luminance degradation of the light emitting element ED may be larger.

However, since the on-bias processes OBS2, OBS3 in which the bias voltage VOBS is supplied to the drain electrode or the source electrode of the driving transistor DRT may be performed within the skip frame, the luminance degradation of the light emitting element may be reduced.

At this time, the bias voltage VOBS supplied to the drain electrode or the source electrode of the driving transistor DRT within the skip frame may be same level as the bias voltage VOBS supplied to the drain electrode of the driving transistor DRT within the refresh frame. Alternatively, they may be different levels.

As a result, the hysteresis of the driving transistor DRT is reduced in the refresh frame and the skip frame of the second mode Mode 2 driven at a low speed driving frequency, and the luminance degradation of the light emitting element ED may be reduced while passing through the refresh frame and the skip frame. Therefore, it is possible to reduce quality defects such as flicker occurring in the second mode Mode 2 driven at a low speed driving frequency.

Meanwhile, the display device 100 according to an embodiment of the present disclosure may further reduce the luminance degradation in the second mode Mode 2 by supplying the bias voltage VOBS within the refresh frame of a second mode Mode 2 driven at a low speed driving frequency, and at the same time, by controlling the level of the bias voltage VOBS, the stabilization voltage Vini, or the reset voltage VAR supplied within the skip frame.

Figure 10:
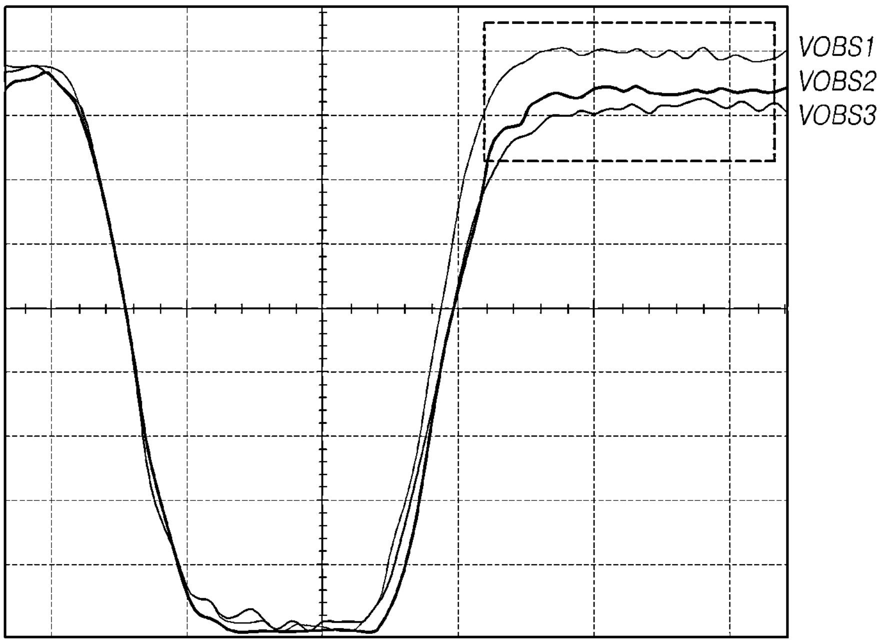
FIGS. 10 to 12 illustrate changes in current flowing through a light emitting element according to levels of a bias voltage, a stabilization voltage, and a reset voltage in a display device according to an embodiment of the present disclosure.
Figure 11:
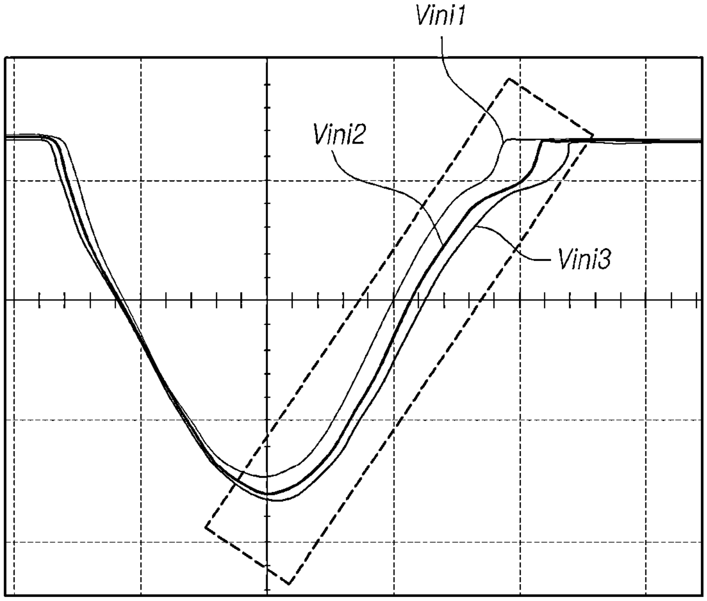
Figure 12:
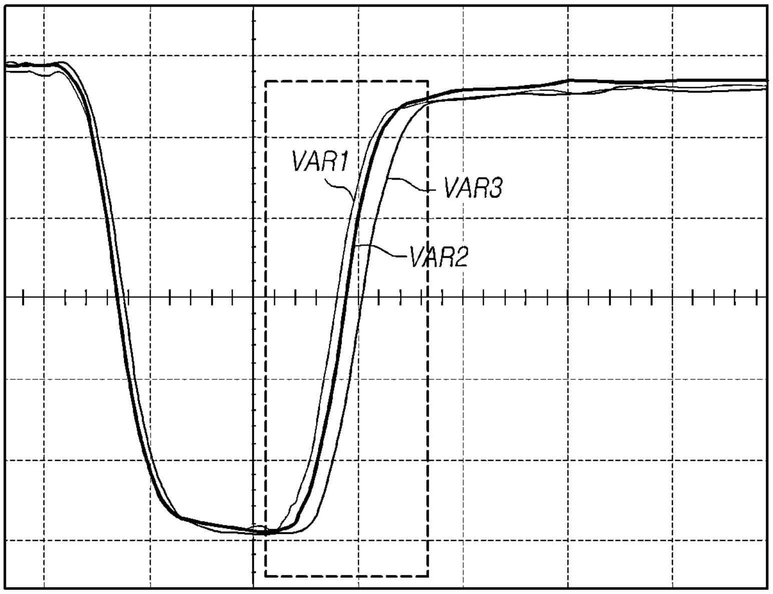

FIGS. 10 to 12 illustrate changes in current flowing through a light emitting element according to levels of a bias voltage, a stabilization voltage, and a reset voltage in a display device according to an embodiment of the present disclosure.

Referring to FIGS. 10 to 12, in the display device 100 according to an embodiment of the present disclosure, the level of current flowing through the light emitting element ED may be different in a light emitting period according to the levels of the bias voltage VOBS, the stabilization voltage Vini, and the reset voltage VAR.

Accordingly, the luminance deviation between the first mode Mode 1 driven at the high speed driving frequency and the second mode Mode 2 driven at the low speed driving frequency may be reduced by detecting the luminance deviation between the first mode Mode 1 and the second mode Mode 2, and by controlling the levels of the bias voltage VOBS, the stabilization voltage Vini, and the reset voltage VAR supplied in the first mode Mode 1 or the second mode Mode 2.

In this case, the level of the bias voltage VOBS (e.g., VOBS1, VOBS2, and VOBS3 in FIG. 10) may be determined by reflecting the luminance degradation of the light emitting element ED according to the frequency change.

Meanwhile, the stabilization voltage Vini (e.g., Vini1, Vini2, and Vini3 in FIG. 11) may be determined according to the level or grayscale of the data voltage Vdata supplied through the data line DL in the refresh frame of the first mode Model or the second mode Mode 2.

In addition, the reset voltage VAR (e.g., VAR1, VAR2, and VAR3 in FIG. 12) may be determined according to the level of the low potential driving voltage VSS of the subpixel SP in the refresh frame of the first mode Mode 1 or the second mode Mode 2.

In addition, the display device 100 according to an embodiment of the present disclosure may be applied to various structures of subpixels SP.

Figure 13:
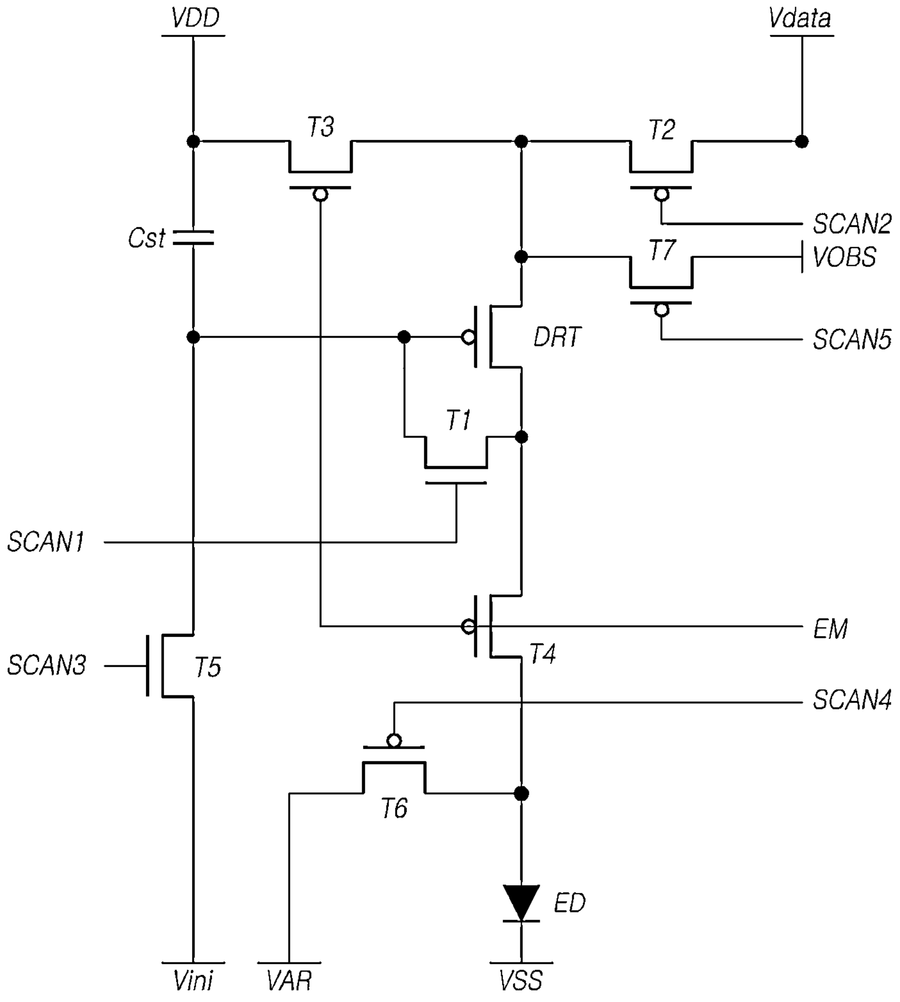
FIG. 13 illustrates a diagram of another subpixel circuit in a display device according to an embodiment of the present disclosure.

FIG. 13 illustrates a diagram of another subpixel circuit in a display device according to an embodiment of the present disclosure.

Referring to FIG. 13, a subpixel SP of the display device 100 according to an embodiment of the present disclosure includes first to seventh switching transistors T1 to T7, a driving transistor DRT, a storage capacitor Cst and a light emitting element ED.

Here, the light emitting element ED may be, for example, a self-emissive element capable of emitting light by itself, such as an organic light emitting diode OLED.

In the subpixel SP according to an embodiment of the present disclosure, the second to fourth switching transistors T2 to T4, the sixth switching transistor T6, the seventh switching transistor T7 and the driving transistor DRT may be P-type transistors. Also, the first switching transistor T1 and the fifth switching transistor T5 may be N-type transistors.

The P-type transistor is relatively more reliable than the N-type transistor. The P-type transistor has an advantage that the current flowing through the light emitting element ED is not influenced by the storage capacitor Cst since the drain electrode is fixed to the high potential driving voltage VDD. Therefore, the current tends to be supplied stably.

For example, the P-type transistor may be connected to the anode electrode of the light emitting element ED. At this time, a constant current can flow regardless of changes in the current and threshold voltage of the light emitting element ED when the transistors T4, T6 connected to the light emitting element ED operate in a saturation region. So, reliability is relatively high.

In this subpixel SP structure, the N-type transistors T1, T5 may be oxide transistors formed using a semiconducting oxide (for example, transistors with a channel formed from a semiconducting oxide such as indium, gallium, zinc oxide or IGZO), and other P-type transistors DRT, T2 to T4, T6, T7 may be silicon transistors formed from semiconductors such as silicon (for example, transistors with a polysilicon channel formed by low temperature process like LTPS or low temperature polysilicon).

The oxide transistor has a relatively low leakage current compared to the silicon transistor. Therefore, when it is implemented using the oxide transistor, leakage current from the gate electrode of the driving transistor DRT is reduced compared to the silicon transistor, and there is an effect that can reduce the defect of image quality like flicker.

Meanwhile, the remaining P-type transistors DRT, transistors T2 to T4, T6, T7 except for the first switching transistor T1 and the fifth switching transistor T5 corresponding to the N-type transistor may be made of low temperature polysilicon.

A first scan signal SCAN1 is supplied to the gate electrode of the first switching transistor T1. A drain electrode of the first switching transistor T1 is connected to a gate electrode of the driving transistor DRT. A source electrode of the first switching transistor T1 is connected to a source electrode of the driving transistor DRT.

The first switching transistor T1 is turned on by the first scan signal SCAN1, and controls the operation of the driving transistor DRT using a high potential driving voltage VDD stored in the storage capacitor Cst.

The first switching transistor T1 may be formed of an N-type MOS transistor to constitute an oxide transistor. Since the N-type MOS transistor uses electrons as carriers, it has higher mobility and fast switching speed than the P-type MOS transistor.

A second scan signal SCAN2 is supplied to the gate electrode of the second switching transistor T2. Data voltage Vdata may be supplied to the drain electrode of the second switching transistor T2. A source electrode of the second switching transistor T2 is connected to a drain electrode of the driving transistor DRT.

The second switching transistor T2 is turned on by the second scan signal SCAN2 to supply the data voltage Vdata to the drain electrode of the driving transistor DRT.

A light emitting signal EM is supplied to the gate electrode of the third switching transistor T3. The high potential driving voltage VDD is supplied to a drain electrode of the third switching transistor T3. A source electrode of the third switching transistor T3 is connected to a drain electrode of the driving transistor DRT.

The third switching transistor T3 is turned on by the light emitting signal EM to supply the high potential driving voltage VDD to the drain electrode of the driving transistor DRT.

The light emitting signal EM is supplied to the gate electrode of the fourth switching transistor T4. A drain electrode of the fourth switching transistor T4 is connected to a source electrode of the driving transistor DRT. A source electrode of the fourth switching transistor T4 is connected to an anode electrode of the light emitting element ED.

The fourth switching transistor T4 is turned on by the light emitting signal EM to supply a driving current to the anode electrode of the light emitting element ED.

A third scan signal SCAN3 is supplied to a gate electrode of the fifth switching transistor T5.

Here, the third scan signal SCAN3 may be the first scan signal SCAN1 supplied to a subpixel SP at another position. For example, when the first scan signal SCAN1 is supplied to nth gate line, the third scan signal SCAN3 may be the first scan signal SCAN1[n-9] supplied to (n-9)th gate line. That is, the third scan signal SCAN3 may be used as the first scan signal SCAN1 at another gate line GL according to a driving phase of the display panel 110.

A stabilization voltage Vini is supplied to a drain electrode of the fifth switching transistor T5. A source electrode of the fifth switching transistor T5 is connected to a gate electrode of the driving transistor DRT and the storage capacitor Cst.

The fifth switching transistor T5 is turned on by the third scan signal SCAN3 to supply the stabilization voltage Vini to the gate electrode of the driving transistor DRT.

A fourth scan signal SCAN4 is supplied to a gate electrode of the sixth switching transistor T6.

A reset voltage VAR is supplied to the drain electrode of the sixth switching transistor T6. The source electrode of the sixth switching transistor T6 is connected to the anode electrode of the light emitting element ED.

The sixth switching transistor T6 is turned on by the fourth scan signal SCAN4 to supply the reset voltage VAR to the anode electrode of the light emitting element ED.

The fifth scan signal SCAN5 is supplied to the gate electrode of the seventh switching transistor T7.

The bias voltage VOBS is supplied to the drain electrode of the seventh switching transistor T7. The source electrode of the seventh switching transistor T7 is connected to the drain electrode of the driving transistor DRT.

Here, the fifth scan signal SCAN5 may be the fourth scan signal SCAN4 with different phase supplied to a subpixel SP at another position. For example, when the fourth scan signal SCAN4 is supplied to nth gate line, the fifth scan signal SCAN5 may be the fourth scan signal SCAN4[n-1] supplied to (n-1)th gate line. That is, the fifth scan signal SCAN5 may be used as the fourth scan signal SCAN4 at another gate line GL according to a driving phase of the display panel 110.

Meanwhile, since the fifth scan signal SCAN5 is a signal for supplying the bias voltage VOBS to the driving transistor DRT, it may be distinguished from the second scan signal SCAN2 for supplying the data voltage Vdata.

The gate electrode of the driving transistor DRT is connected to the drain electrode of the first switching transistor T1. The drain electrode of the driving transistor DRT is connected to the source electrode of the second switching transistor T2. The source electrode of the driving transistor DRT is connected to the source electrode of the first switching transistor T1.

The driving transistor DRT is turned on by the voltage difference between the source electrode and the drain electrode of the first switching transistor T1 to supply a driving current to the light emitting element ED.

A high potential driving voltage VDD is supplied to one side of the storage capacitor Cst and the other side of the storage capacitor Cst is connected to the gate electrode of the driving transistor DRT. The storage capacitor Cst stores a voltage of the gate electrode of the driving transistor DRT.

The anode electrode of the light emitting element ED is connected to the source electrode of the fourth switching transistor T4 and the source electrode of the sixth switching transistor T6. A low potential driving voltage VSS is supplied to a cathode electrode of the light emitting element ED.

The light emitting element ED emits light with a predetermined luminance due to the driving current controlled by the driving transistor DRT.

At this time, the stabilization voltage Vini is supplied to stabilize the change of the capacitance formed in the gate electrode of the driving transistor DRT. The reset voltage VAR is supplied to reset the anode electrode of the light emitting element ED.

When the reset voltage VAR is supplied to the anode electrode of the light emitting element ED in a state that the fourth switching transistor T4 is turned off, the anode electrode of the light emitting element ED can be reset.

The sixth switching transistor T6 for supplying the reset voltage VAR is connected to the anode electrode of the light emitting element ED.

In order that the driving operation of the driving transistor DRT and the resetting operation of the anode electrode of the light emitting element ED are separately performed, the third scan signal SCAN3 for driving or stabilizing the driving transistor DRT and the fourth scan signal SCAN4 for controlling the supply of the reset voltage VAR to the anode electrode of the light emitting element ED are separated from each other.

When the switching transistors T5, T6 for supplying the stabilization voltage Vini and the reset voltage VAR are turned on, the fourth switching transistor T4 which connects the source electrode of the driving transistor DRT to the anode electrode of the light emitting element ED may be turned off. As a result, the driving current of the driving transistor DRT is blocked so as not to flow to the anode electrode of the light emitting element ED, so that the anode electrode is not affected by voltages other than the reset voltage VAR.

As described above, the subpixel SP including the eight transistors DRT, T1, T2, T3, T4, T5, T6, T7 and one capacitor Cst may be referred to as an 8T1C structure.

As previously described, the 8T1C structure is shown as an example among various type of subpixel SP circuits. The structure and number of transistors and capacitors constituting the subpixel SP may be variously changed. Meanwhile, each of the plurality of subpixels SP may have the same structure, or some of the plurality of subpixels SP may have different structures.

As described above, the display device 100 according to an embodiment of the present disclosure may reduce the hysteresis and luminance degradation of the light emitting element ED by supplying the bias voltage VOBS to the drain electrode or the source electrode of the driving transistor DRT in the refresh frame of the second mode Mode 2 driven at a low speed driving frequency.

In addition, it is possible to further reduce the luminance deviation appearing in the second mode Mode 2 by controlling the level of the bias voltage VOBS, the stabilization voltage Vini or the reset voltage VAR supplied in the skip frame of the second mode Mode 2 driven at a low speed driving frequency.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A display device, comprising:

a display panel including a light emitting element, a driving transistor having a first node being a gate electrode, a second node being a drain electrode, and a third node being a source electrode, and configured to provide a driving current to the light emitting element, a plurality of switching transistors configured to control an operation of the driving transistor, and a storage capacitor having first electrode and second electrode;

a gate driving circuit configured to supply a plurality of scan signals to the display panel;

wherein the plurality of switching transistors include;

a first switching transistor turned on by a first scan signal, the first switching transistor configured to diode-connect the first node and the third node;

a second switching transistor turned on by a second scan signal, the second switching transistor configured to supply a data voltage or a bias voltage to the second node;

a third switching transistor turned on by a light emitting signal, the third switching transistor configured to supply a high potential driving voltage from a fourth node connected to the first electrode of the storage capacitor to the second node;

a fourth switching transistor turned on by the light emitting signal, the fourth switching transistor configured to form a current path between the driving transistor and the light emitting element; and a fifth switching transistor turned on by a third scan signal, the fifth switching transistor configured to supply a first voltage to the first node, wherein the first electrode of the storage capacitor is connected to the fourth node, wherein the second electrode of the storage capacitor is connected to the first node, wherein the display panel including a plurality of subpixels, driven in a high-speed mode at a high driving frequency and in a low-speed mode at a low driving frequency that is less than the high driving frequency, wherein a data voltage is supplied to the display panel during a first period and the bias voltage is supplied to the driving transistor in a second period in the low-speed mode, and wherein the second period is a period after the first period and before a light emitting period of the light emitting element.

2. The display device of claim 1, wherein the plurality of switching transistors further comprise a sixth switching transistor turned on by fourth scan signal, the sixth switching transistor configured to apply a second voltage to a fifth node, wherein the fifth node is an anode electrode of the light emitting element.

3. The display device of claim 2, wherein the fourth scan signal is based on the second scan signal.

4. The display device according to claim 2, further comprising, a data driving circuit configured to supply a plurality of data voltages to the display panel; and a timing controller configured to control the gate driving circuit and the data driving circuit, wherein the bias voltage is supplied to the driving transistor in the second period in which the data voltage from the plurality of data voltages is supplied to the display panel at the low-speed mode which the display panel is driven under a predetermined speed frequency, wherein the bias voltage is supplied after the first period for a characteristic value of the driving transistor and before the light emitting period of the light emitting element in the second period, wherein the plurality of data voltages are supplied to the display panel during the first period.

5. The display device according to claim 4, wherein a level of the first voltage or the second voltage is controlled in a third period in which the data voltage is not supplied to the display panel after the second period in the low-speed mode.

6. The display device according to claim 5, wherein the first voltage is determined according to a level or grayscale of the data voltage supplied to the display panel in the second period.

7. The display device according to claim 5, wherein the second voltage is determined according to a level of a low potential driving voltage supplied to a cathode electrode of the light emitting element in the second period.

8. The display device according to claim 5, wherein the bias voltage is supplied to the driving transistor in the third period in which the data voltage is not supplied to the display panel after the second period at the low-speed mode.

9. The display device according to claim 8, wherein the bias voltage is supplied to the driving transistor more than one time in the third period.

10. The display device according to claim 8, wherein the bias voltage supplied in the second period and the bias voltage supplied to the third period have different voltage levels.

11. The display device according to claim 8, wherein the bias voltage is controlled at a time when the display panel is driven from the high-speed mode, which is driven at a frequency higher than the predetermined speed frequency, to the low-speed mode.

12. The display device according to claim 5, wherein the first voltage is controlled at a time when the display panel is driven from the high-speed mode, which is driven at a frequency higher than the predetermined speed frequency, to the low-speed mode.

13. The display device according to claim 5, wherein the second voltage is controlled at a time when the display panel is driven from the high-speed mode, which is driven at a frequency higher than the predetermined speed frequency, to the low-speed mode.

14. The display device of claim 1, wherein the third scan signal is based on the first scan signal.

15. The display device of claim 14, wherein the third scan signal includes the first scan signal that is provided to a first subpixel which is located on a different location of a second subpixel comprising the driving transistor and the plurality of switching transistors.

16. The display device of claim 14, wherein the third scan signal is used as the first scan signal at another gate line which is different from a gate line connected with the second switching transistor according to a driving phase of the display panel.

17. The display device of claim 1, wherein the first switching transistor is an oxide transistor.

18. The display device of claim 1, wherein the fifth switching transistor is an oxide transistor.

19. The display device according to claim 1, wherein the plurality of switching transistors further comprise:

a seventh switching transistor turned on by a fifth scan signal, the seventh switching transistor configured to supply the bias voltage to the third node.

* * * * *